US006436850B1

(12) United States Patent
Morales

(10) Patent No.: US 6,436,850 B1
(45) Date of Patent: Aug. 20, 2002

(54) METHOD OF DEGASSING LOW K DIELECTRIC FOR METAL DEPOSITION

(76) Inventor: Guarionex Morales, 859 Blair Ave., Apt.. #4, Sunnyvale, CA (US) 94087

(*) Notice: Subject to any disclaimer, the term of this patent is extended or adjusted under 35 U.S.C. 154(b) by 0 days.

(21) Appl. No.: 09/652,132

(22) Filed: Aug. 31, 2000

(Under 37 CFR 1.47)

Related U.S. Application Data

(60) Provisional application No. 60/151,921, filed on Sep. 1, 1999.

(51) Int. Cl.[7] .................. H01L 21/4763; H01L 21/44; H01L 21/469
(52) U.S. Cl. .................. 438/781; 438/622; 438/623; 438/624; 438/637; 438/652; 438/653; 438/783
(58) Field of Search .................. 438/622–624, 438/637–640, 780–283, 652–654

(56) References Cited

U.S. PATENT DOCUMENTS

| | | | | |
|---|---|---|---|---|
| 5,591,677 | A | | 1/1997 | Jeng .................. 438/623 |
| 5,656,555 | A | | 8/1997 | Cho .................. 438/760 |
| 6,278,174 | B1 | * | 8/2001 | Havemann et al. |
| 6,287,955 | B1 | * | 9/2001 | Wang et al. |
| 6,291,331 | B1 | * | 9/2001 | Wang et al. |
| 6,365,959 | B2 | * | 5/2002 | Yuasa et al. |

* cited by examiner

*Primary Examiner*—Ha Tran Nguyen

(57) ABSTRACT

Multi-metallization level semiconductor devices are formed without degrading a low k dielectric gap fill material due to multiple pre-metallization degassing/outgassing heat treatments. Degradation of the low k material is substantially reduced or eliminated by employing time intervals for heat treatment which are not longer than the longest metal deposition step and temperatures below that which the dielectric material decomposes.

14 Claims, 1 Drawing Sheet

US 6,436,850 B1

METHOD OF DEGASSING LOW K DIELECTRIC FOR METAL DEPOSITION

RELATED APPLICATIONS

This application claims priority from Provisional Application Ser. No. 60/151,921 filed on Sep. 1, 1999 entitled: "LOW K DIELECTRIC DEGAS FOR METAL DEPOSITION", the entire disclosure of which is hereby incorporated therein.

FIELD OF THE INVENTION

The present invention relates to a method of manufacturing high-density, multi-metal layer semiconductor devices exhibiting reliable interconnection patterns. The invention has particular applicability in manufacturing high-density, multi-metal layer semiconductor devices with design features of 0.25 micron and under.

BACKGROUND OF THE INVENTION

The escalating requirements for high densification and performance associated with ultra-large scale integration semiconductor devices necessitate design features of 0.25 micron and under, such as 0.18 micron, increased transistor and circuit speeds, high reliability, and increased manufacturing throughput. The reduction of design features to 0.25 micron and under challenges the limitations of conventional interconnection technology, including conventional photolithographic, etching, and deposition techniques.

Conventional methodology for forming patterned metal layers comprises a subtractive etching or etch back step as the primary metal forming technique. Such a method involves the formation of a first dielectric layer on a semiconductor substrate, typically monocrystalline silicon (Si), with conductive contacts formed therein for electrical connection with an active region in or on the substrate, such as a source/drain region. A metal layer, such as of aluminum or an aluminum alloy, is deposited on the first dielectric layer, and a photoresist mask having a pattern corresponding to a desired conductive pattern is formed on the metal layer. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is then planarized, for example, by conventional etching or chemical-mechanical polishing (CMP) techniques.

As feature sizes, e.g., metal lines and interwiring spacings, shrink to 0.25 micron and below, such as 0.18 micron and below, it becomes increasingly difficult to satisfactorily fill in the interwining spacings voidlessly and obtain adequate step coverage. It also becomes increasingly difficult to form a reliable inter-level interconnection structure. A through-hole is typically formed in a dielectric layer to expose a selected portion of an underlying metal feature, wherein the exposed portion of the metal feature at the bottom of the through-hole serves as a contact pad. Upon filling the through-hole with conductive material, such as a metal plug, to form a conductive via, the bottom surface of the conductive via is in contact with the underlying metal feature.

Because many large scale integration (LSI) devices presently manufactured are very complex and require multiple levels of metallization for interconnections, it has been common to repeat the above-described via formation process multiple times, e.g., to form as many as five levels of metallization interconnected by conductive vias. A semiconductor device of the above-described type including, for illustrative purposes, three levels of metallization, and a manufacturing process therefor is explained in more detail below with reference to FIG. 1.

As schematically shown in FIG. 1, a semiconductor device 1 of the above-described type comprises a semiconductor substrate 8, typically a doped monocrystalline silicon wafer, having formed therein or thereon at least one active region (not shown for illustrative simplicity), e.g. a source/drain region, a transistor, a diode, and/or other semiconductor elements well known in the art. A first dielectric layer 9 of e.g. a silicon oxide, is formed over substrate 8 and includes at least one electrical contact 10, schematically shown for illustration, for electrically connecting the active structure(s) of semiconductor substrate 8 to a first metal feature 11 comprising a first patterned metal layer formed over first dielectric layer 9. First metal feature 11 is typically formed as a composite structure comprising a thin lower metal layer 11A, of e.g., titanium (Ti) or tungsten (W), a thicker intermediate or primary conductive layer 11B, of e.g., aluminum (Al) or an Al alloy, and an upper, thin, electrically conductive antireflective coating (ARC) 11C, of e.g., titanium nitride (TiN). After formation of the first metal feature 11, a second dielectric layer 12, referred to as a "gap-fill" layer, is deposited to fill the interwiring spaces 12A, i.e., the spaces between the first metal features 11. Materials employed for the gap-filling second dielectric layer 12 include, for example, spin-on glass (SOG), high density plasma oxide (HDPO), and low dielectric constant ("low k") materials having an as-deposited dielectric constant below 3.9, such as polytetrafluoroethylene (TEFLON™), parylene, polyimide, hydrogen silsesquioxane (HSQ), and benzocyclobutene (BCB), the latter two materials being preferred.

A third dielectric layer 13, typically a silicon oxide obtained by plasma enhanced chemical vapor deposition (PECVD) of silane ($SiH_4$) in an $N_2O$ atmosphere or by PECVD of tetraethylorthosilicate (TEOS) in the presence of oxygen, is then formed over the second dielectric layer 12 and planarized. A thorough-hole 14, extending through the second and third dielectric layers 12 and 13, is then formed in accordance with conventional practices so that an upper surface portion 11D of the first metal feature 11 is exposed by and encloses the bottom opening of the through-hole 14, thereby providing a contact pad for a metal plug 15, typically of tungsten (W), forming a via 16. Layer 17 shown as lining the internal surfaces of the through-hole 14, is formed prior to metal plug 15 filling and serves as an adhesion promoting and/or barrier layer. Layer 17 is typically formed of an electrically conductive refractory material such as TiN, Ti—W, and Ti—TiN.

Second metal feature 18 comprising a metal composite similar to first metal feature 11 is then formed by depositing a composite metal layer atop the third dielectric layer 13 and in electrical contact with the first metal feature 11 through via 16, and patterning the layer by means of conventional techniques. Conductive via 16 thus electrically connects first metal feature 11 with second metal feature 18. As illustrated, second metal feature 18 comprises a thin, lower metal layer 18A, thicker intermediate or primary layer 18B, and thin, upper, electrically conductive AR layer 18C.

After formation of the second metal feature 18, a fourth dielectric layer 19 of low k gap-fill material similar to that of second dielectric layer 12 is formed so as to fill the interwiring spaces 19A between the second metal features 18. Fifth dielectric layer 20 of a material similar to that of third dielectric layer 13 is then formed over fourth dielectric layer 19 and planarized by such techniques as employed previously with third dielectric layer 13. As before, a through-hole 21 is formed to extend through fourth and fifth dielectric layers 19, 20 so as to expose a portion 18D of the upper surface of the second metal feature 18 for serving as a contact pad. Metal plug 22 filling through-hole 21 and constituting a second electrically conductive via 23 is formed similarly to first via 16, i.e. by depositing a layer 24 of adhesion promoting and/or barrier material on the internal surface of through-hole 21 prior to filling with metal plug 22.

As illustrated, a third metal feature 25, formed of a composite of layers 25A, 25B, and 25C analogous to layers 11A, 11B, 11C, 18A, 18B, 18C of the first and second metal features 11 and 18, is then formed over fifth dielectric layer 20 and in electrical contact with metal plug 22 of via 23 which electrically connects the second and third metal features 18 and 25.

The above-described process of metal feature formation, dielectric gap-filling, and via formation may be repeated, as desired, in order to fabricate high-density large scale integration (LSI) devices with multiple levels of interconnection. Typical devices currently manufactured include up to five levels of such metallization interconnected by vias.

The impetus for achieving increased component density and attendant reduction in feature size in semiconductor structures such as described above generates numerous problems. For example, as feature sizes, e.g. metal lines and interwiring spaces, shrink to 0.25 micron and below, it becomes increasingly difficult to satisfactorily fill in (i.e. gap fill) the interwiring spacings with a dielectric gap-filling material and obtain adequate step coverage.

In addition, such dielectric gap filling thin films must be capable of serving multiple purposes, including: preventing unwanted shorting of neighboring conductors or conducting levels, by acting as a relatively rigid insulating spacer; preventing corrosion or oxidation of metal conductors, by acting as a barrier to moisture and mobile ions; filling deep, narrow gaps between closely spaced conductors; and planarizing uneven circuit topography so that a level of conductors can then be reliably deposited on a film surface which is substantially flat. Another important requirement of such dielectric thin films is a relatively low dielectric constant k, as compared to silicon dioxide (k=3.9), to lower power consumption, crosstalk, and signal delay for closely spaced conductors.

Dielectric thin films deposited from hydrogen silsesquioxane (HSQ) resins have been found to possess many of the above-recited properties desirable for gap-filling applications. As applied to multi-level semiconductor devices of the type illustrated in FIG. 1, HSQ offers many advantages as a gap-filling dielectric material for use as e.g. the second and fourth dielectric layers 12 and 19, respectively, as well as for sixth, eighth, tenth, etc. dielectric gap filling layer required for metallization levels in excess of those shown in the example of FIG. 1. HSQ is relatively carbon-free, thereby rendering it unnecessary to etch it back below the upper surface of the metal lines 11, 18, and 25 in order to avoid poisoned via problems. In addition, HSQ exhibits excellent planarity and is capable of gap filling interwiring spacings less than 0.15 micron employing conventional spin-on equipment. As deposited, HSQ is considered a relatively low k material (k=2.9–3.0) compared to silicon dioxide grown by a thermal oxidation or chemical vapor deposition (CVD) process (k=3.9–4.2). The mentioned dielectric constants are based upon a scale wherein 1.0 represents the dielectric constant of air. However, HSQ is hydrophilic, i.e. it has a propensity to absorb moisture which can deleteriously affect metal adhesion thereto, increase metal corrosion, and degrade circuit performance.

Other hydrogen-containing low k materials suitable for use as dielectric gap filling layers in metallization processing include, but are not limited to parylene, polyimide, and benzocyclobutene (BCB).

However, in applying HSQ and other such hydrophilic, low k dielectric materials (e.g. BCB) to multilevel metallization processing, it was found that such materials tend to decompose and lose their low k property when subjected to high temperatures, as may be encountered during metallization. For example, and with reference to the device illustrated in FIG. 1, it was found necessary, in order to ensure adequate adhesion of the metal layers to the dielectric layers and to minimize void formation, to subject each of the second (12) and third (13), fourth (19) and fifth (20), etc. dielectric layer pairs to a heat treatment to remove adsorbed water vapor and/or oxygen molecules from the surfaces of the dielectric layers prior to metallization of the first (14), second (21), etc. through-holes and deposition of the first (11), second (18), third (25), etc. metal layers. Such predeposition degassing heat treatments typically comprise heating the semiconductor wafer with the aforementioned dielectric layer pairs formed thereon to temperatures in the range of about 250° C. to about 450° C. for about 30 seconds to about 200 seconds in a dry, inert atmosphere. In a device having five (5) metallization levels, the dielectric layer pair at the first metallization level ($M_1$) will experience four (4) such degas heat treatments, the dielectric pair at the second metallization level ($M_2$) will experience three (3) degas heat treatments, etc. Thus the dielectric layer pairs, particularly those of the lower metallization levels, experience cumulative degassing treatments at elevated temperatures which result in degradation of at least the HSQ layer of the dielectric layer pairs with consequential poor adhesion and void formation of the metallization layers.

Thus, there exists a need for a degassing heat treatment which substantially reduces or eliminates degradation of dielectric layer pairs during metallization processing.

DISCLOSURE OF THE INVENTION

An advantage of the present invention is a method of manufacturing a high density, multi-metal layer semiconductor device with an improved metallization structure.

Another advantage of the present invention is a method for reducing or substantially eliminating degradation of low k dielectric gap filling layers in multi-metal level semiconductor devices.

Still another advantage of the present invention is a method for minimizing the time during which a multi-metal level semiconductor device is subjected to high temperature degassing of dielectric layers prior to metal deposition thereon.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of manufacturing a multilevel semiconductor device, which method comprises:

forming a first dielectric layer on a substrate;

forming a first patterned metal layer on the first dielectric layer, the first patterned metal layer having gaps therein and comprising a first metal feature;

forming a second dielectric layer covering the first patterned metal layer and filling the gaps, the second dielectric layer comprising a low dielectric constant (low k) material;

forming a third dielectric layer over the second dielectric layer;

forming a first through-hole in the second and third dielectric layers, the first through-hole exposing a portion of the upper surface of the first metal feature;

subjecting the exposed surfaces of the second and third dielectric layers to a degassing heat treatment at a temperature below which the low k material is degraded and for a first time interval;

immediately after the degassing heat treatment, depositing, for a second time interval, a plug of electrically conductive material filling the first through-hole, thereby defining a first via; and depositing, for a third time interval, a first electrically conductive layer on the third dielectric layer and in electrical contact with the first via;

wherein, the first time interval is equal to or shorter than the longer of the second and third time intervals.

According to a further embodiment, the method of the present invention comprises the further steps of:

patterning the first electrically conductive layer to form a second patterned metal layer having gaps therein and defining a second metal feature electrically connected to the first metal feature through the first via;

forming a fourth dielectric layer covering the second patterned metal layer and filling the gaps therein, the fourth dielectric material comprising a low k material;

forming a fifth dielectric layer over the fourth dielectric layer;

forming a second through-hole in the fourth and fifth dielectric layers, the second through-hole exposing a portion of the upper surface of the second metal feature;

subjecting the exposed surfaces of the fourth and fifth dielectric layers to a degassing heat treatment at a temperature below that which the low k material(s) of the second and fourth dielectric layers is (are) degraded and for a fourth time interval;

immediately after the preceding heat treatment, depositing, for a fifth time interval, a plug of electrically conductive material filling the second through-hole, thereby defining a second via; and depositing, for a sixth time interval, a second electrically conductive layer on the fifth dielectric layer and in electrical contact with the second via;

wherein, the fourth time interval is equal to or less than the longer of the fifth and sixth time intervals.

In preferred embodiments according of the present invention, the low k dielectric material is HSQ and each of the degassing heat treatments is performed at a temperature less than about 400° C. for less than about 45–60 seconds. In other preferred embodiments, the low k dielectric material is BCB and each of the degassing heat treatments is performed at a temperature less than about 350° C. for less than about 45–60 seconds.

Additional advantages of the present invention will become readily apparent to those skilled in this art from the following detailed description, wherein only the preferred embodiment of the invention is shown and described, simply by way of illustration of the best mode contemplated for carrying out the method of the invention. As will be realized, the invention is capable of other and different embodiments, and its several details are capable of modifications in various obvious respects, all without departing from the invention. Accordingly, the drawings and description are to be regarded as illustrative in nature, and not as limitative.

DESCRIPTION OF THE INVENTION

Figure 1:
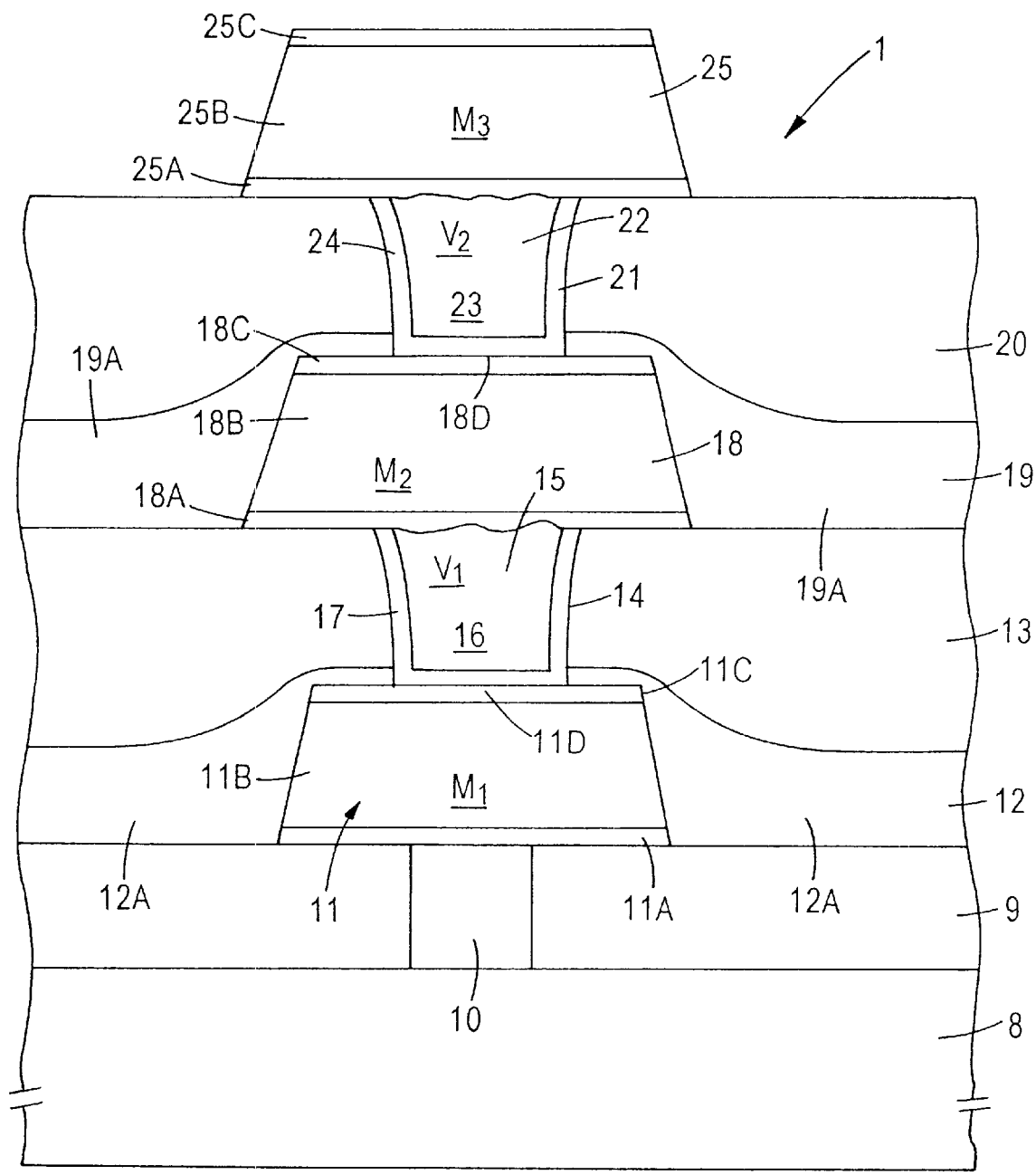
FIG. 1 schematically illustrates, in cross-sectional view, a portion of a multilayer semiconductor device according to an embodiment of the present invention and having a plurality of electrically conductive vias formed therein.

Referring again to FIG. 1, shown therein is an illustrative embodiment of a multilevel semiconductor device according to an embodiment of the present invention comprising three (3) metallization features or levels 11, 18, and 25, in ascending order from semiconductor substrate 8, which features or levels may be alternatively designated as $M_1$, $M_2$, and $M_3$, respectively. In current practice, multilevel devices of similar structure but having five (5) or more levels of metallization may be fabricated. As illustrated, a first via 16 (alternatively designated $V_1$) electrically connects metallization levels $M_1$ and $M_2$ and a second via 23 ($V_2$) electrically connects metallization levels $M_2$ and $M_3$. Additional levels of metallization, for example $M_n$ and $M_{n+1}$, would be electrically connected by via $V_n$.

According to the invention, the basic process steps in fabricating the exemplary device are as previously described. Suffice it to say, first dielectric layer 9 is formed over a semiconductor substrate 8, typically a doped monocrystalline silicon wafer having at least one active region (not shown) formed therein or thereon. At least one electrical contact 10 extending through first dielectric layer 9 and electrically contacting the at least one active region is then formed by conventional techniques. A composite first metal layer 11, comprising sub-layers 11A, 11B, and 11C, is then formed on the first dielectric layer 9 and patterned in a conventional manner to define a first metal feature (or level) $M_1$. A second dielectric layer 12 of low k material is then deposited to fill the gaps 12A between the first metal feature $M_1$. According to a preferred embodiment of the present invention, second dielectric layer 12 of low k material comprises hydrogen silsesquioxane (HSQ) having an as-deposited dielectric constant of about 2.9–3.0. Third dielectric layer 13 is next deposited atop the second dielectric layer 12 and planarized according to conventional techniques such as etching or chemical-mechanical (CMP) polishing. According to a preferred embodiment of the invention, third dielectric layer 13 comprises a silicon oxide obtained by plasma enhanced chemical vapor deposition (PECVD) of silane ($SiH_4$) in an $N_2O$ atmosphere or by PECVD of tetraethyl orthosilicate (TEOS) in the presence of oxygen.

Through-hole 14 is then formed, utilizing conventional selective etching procedures, extending through the third dielectric layer 13 and the underlying portion of the second dielectric layer 12 overlying the first metal feature or level $M_1$. According to conventional practice, the thus-far produced structure including exposed surfaces of the second and third dielectric layers 12, 13 is then subjected to a pre-metallization heat treatment for about 30 seconds to about 200 seconds at temperatures up to but not exceeding the decomposition temperature of the low k gap fill material of the second dielectric layer 12. Such heat treatment is performed to remove water ($H_2O$) vapor and oxygen ($O_2$) molecules absorbed on the surfaces of the dielectric layers, thereby ensuring adequate adhesion of the metallization layer(s) and via plugs and avoiding formation of voids therein. Such heat treatment is significant when using a hydrophilic, low k gap-fill dielectric material, such as HSQ, to outgas any $H_2O$ vapor contained therein.

Following such degassing/outgassing heat treatment, at least one layer 17 of electrically conductive barrier or adhesion-promoting material is deposited over a preselected time interval by any suitable means, such as chemical vapor deposition (CVD) or physical vapor deposition (PVD), to line the internal wall surface of the through-hole 14 and to cover the exposed portion of the upper surface of the first metallization level $M_1$. In a preferred embodiment, layer 17 comprises about 100 Å to 200 Å of Ti in contact with the internal wall and first metallization level surfaces and about 100 Å to 200 Å of TiN deposited by CVD of an organotitanium compound, illustratively tetrakisdimethylamino titanium.

Following deposition of layer 17, metal plug 15 is deposited over a preselected time interval to fill the first through-hole 14, thereby completing formation of first via $V_1$. According to a preferred embodiment of the present invention, the metal plug comprises tungsten (W) chemically vapor deposited from tungsten hexafluoride. A second metal layer 18, comprising sub-layers 18A, 18B, and 18C as previously described, is then deposited over respective time intervals $t_1$, $t_2$, and $t_3$ and patterned to form second metallization level or feature $M_2$. The foregoing processes of dielectric gap-fill deposition, planarization, through-hole and via formation, and metallization are repeated, as necessary, to achieve a semiconductor device with multiple metallization levels according to design, e.g., five (5) or more metallization levels.

The present invention stems from the discovery that the properties (e.g., dielectric constant) of the low k gap-fill dielectric materials are adversely affected by performing multiple pre-metallization degassing/outgassing heat treatments during multi-level device fabrication. In this context, it is significant to recognize that for a multi-level device having n levels of metallization, the low k dielectric gap fill layer of the lowermost metallization level $M_1$ will experience n–1 pre-metallization degassing/outgassing heat treatments (of approximately the same duration), the cumulative effect of such multiple heat treatments significantly degrades or decomposes low k dielectric gap fill materials such as HSQ and BCB. By extension, it is apparent that all of the lower metallization levels, which are subjected to a greater number of such heat treatments during the course of device fabrication than the upper levels, experience a greater degree of degradation and decomposition.

The present invention addresses and solves the above-described problem associated with multi-level device fabrication processes requiring multiple degassing/outgassing heat treatments by performing the heat treatment steps at temperatures which are lower than the degradation temperature of the low k dielectric gap fill material and for time intervals which are long enough to remove $H_2O$ and $O_2$ molecules from the surfaces of the dielectric layer pairs prior to metal deposition thereon, but no longer than the longest time interval of the various metal deposition steps. As a consequence, each of the low k dielectric gap fill layers experiences no exposure, or a significantly reduced exposure, to elevated temperatures sufficient to degrade or decompose the dielectric material relative to conventional processing. In addition, device throughput is not reduced by the process of the inventive methodology.

In applying the above-described inventive concept to multi-level device fabrication processing to produce semiconductor devices, such as that illustrated in FIG. 1, it is necessary to take into account each metallization step and its respective preselected time interval, including deposition of the metal layers of each metallization level $M_1, M_2 \ldots M_n$ and each via $V_1, V_2 \ldots V_n$, and to select the time interval for degassing/outgassing heat treatment to be equal to or less than the longest one of the preselected time intervals. More specifically, if the time interval $t_m$ for deposition of the metal layers of each of the metallization levels $M_1, M_2 \ldots M_n$ is longer than the time interval $t_v$ for filling the associated via $V_1, V_2 \ldots V_n$, the time interval for heat treatment is set equal to or less than $t_m$. Conversely, if $t_v > t_m$ the time interval for heat treatment is set equal to or less than $t_v$.

In situations wherein metallization comprises several substeps, as with deposition of metal layers 11, 18, and 25, corresponding to metallization levels $M_1$, $M_2$, and $M_3$, the relevant time interval is determined by the longest of the component sub-steps. For example, metallization layer 11 comprises sublayers 11A, 11B, and 11C, with respective deposition time intervals $t_1$, $t_2$, and $t_3$. The time interval $t_2$ for deposition of the substantially thicker intermediate sublayer 11B would typically determine the value for $t_m$. As for the vias $V_1, V_2 \ldots V_n$, the value for $t_v$ would typically be determined by the time for deposition of the metal plug 15, 22, etc. For metal depositions utilizing the particular metal or metallic materials as in the above described process for making a multilevel semiconductor device, suitable conditions for degassing/outgassing treatment have been determined to be about 45–60 sec. at a temperature less than about 400° C. for HSQ and about 45–60 sec. at a temperature less than about 350° C. for BCB. Suitable conditions for other metals or metallic materials and for other low k gap filling dielectric materials such as parylene and polyimide can be readily determined, given the guidance and objectives disclosed herein. Thus, the time intervals for pre-metal deposition degassing of such inter-layer dielectric (ILD) materials are minimized so as to substantially prevent degradation of low k dielectric materials as in conventional processing employing longer duration degassing/outgassing heat treatments.

The present invention enjoys utility in the fabrication of various types of multilevel semiconductors. Multilevel semiconductor devices formed by the improved method of the invention have been found to be substantially free of the drawbacks associated with conventional multilevel processing, i.e., degradation of dielectric properties of the low k gap filling material and/or decomposition thereof. Thus, the present invention enables the use of temperature sensitive, hydrophilic, low dielectric constant gap filling materials in multilevel interconnection arrangements employing electrically conductive vias and requiring multiple heat treatments during fabrication. Although in the illustrated embodiment, the via is shown as fully bordered for illustrative convenience, the present invention finds equivalent utility in the fabrication of devices utilizing borderless vias, such as disclosed in U.S. Pat. No. 5,619,072.

In the previous descriptions, numerous specific details are set forth, such as specific materials, structures, reactants, processes, etc., in order to provide a thorough understanding of the present invention. However, as one having ordinary skill in the art would recognize, the present invention can be practiced without resorting to the details specifically set forth. In other instances, well-known processing structures and techniques have not been described in detail in order not to unnecessarily obscure the present invention.

Only the preferred embodiments of the invention are shown and described herein. It is to be understood that the invention is capable of use in various other combinations and environments and is capable of changes or modifications within the scope of the inventive concept(s) as expressed herein.

What is claimed is:

1. A method of manufacturing a multilevel semiconductor device, which method comprises the sequential steps of:

forming a first dielectric layer on a substrate;

forming a first patterned metal layer on the first dielectric layer, the first patterned metal layer having gaps therein and comprising a first metal feature;

forming a second dielectric layer covering the first patterned metal layer and filling said gaps, said second dielectric layer comprising a low dielectric constant (low k) material;

forming a third dielectric layer over said second dielectric layer;

forming a first through-hole in said second and third dielectric layers, said first through-hole exposing a portion of the upper surface of the first metal feature;

subjecting the exposed surfaces of the second and third dielectric layers to a degassing heat treatment at a temperature below which the low k material is degraded and for a first time interval;

immediately after the degassing heat treatment, depositing, for a second time interval, a plug of electrically conductive material filling the first through-hole, thereby defining a first via; and depositing, for a third time interval, a first electrically conductive layer on said third dielectric layer and in electrical contact with said first via;

wherein, the first time interval is equal to or shorter than the longer of the second and third time intervals.

2. The method according to claim 1, further comprising patterning the first electrically conductive layer, thereby forming a second patterned metal layer on the third dielectric layer and having gaps therein, wherein the second patterned metal layer comprises a second metal feature electrically connected to the first metal feature through the first via.

3. The method according to claim 2, further comprising:

forming a fourth dielectric layer covering the second patterned metal layer and filling the gaps therein, said fourth dielectric layer comprising a low k material;

forming a fifth dielectric layer over said fourth dielectric layer;

forming a second through-hole in said fourth and fifth dielectric layers, said second through-hole exposing a portion of the upper surface of the second metal feature;

subjecting the exposed surfaces of the fourth and fifth dielectric layers to a degassing heat treatment at a temperature below that which the low k material(s) of the second and fourth dielectric layers is (are) degraded and for a fourth time interval;

immediately after the preceeding heat treatment, depositing, for a fifth time interval, a plug of electrically conductive material filling the second through-hole, thereby defining a second via; and depositing, for a sixth time interval, a second electrically conductive layer on said fifth dielectric layer and in electrical contact with said second via;

wherein, the fourth time interval is equal to or less than the longer of the fifth and sixth time intervals.

4. The method according to claim 3, further comprising repeating, for n times, wherein n=3–5, the steps of:

patterning the just-deposited electrically conductive layer to form a patterned metal layer having gaps therein and comprising a metal feature electrically connected to an underlying metal feature through a via;

forming a dielectric layer comprising a low k material covering the just-patterned metal layer and filling the gaps therein;

forming another dielectric layer over the low k dielectric layer;

forming a through-hole in the two just-deposited dielectric layers, the through-hole exposing a portion of the upper surface of the just-formed metal feature;

subjecting the exposed surfaces of the two just-formed dielectric layers to a degassing heat treatment at a temperature below which the low k material layer(s) is (are) degraded and for a time $t_a$;

immediately after the preceeding degassing heat treatment, depositing, for a time interval $t_b$, a plug of electrically conductive material filling the just-formed through-hole, thereby defining a via;

depositing, for a time interval $t_c$, an electrically conductive layer on the underlying, just-formed dielectric layer and in electrical contact with the just-formed via;

wherein, the time interval $t_a$ is equal to or shorter than the longer of time intervals $t_b$ and $t_c$.

5. The method according to claim 4, wherein each of the low k dielectric layers comprises a material having an as-deposited dielectric constant less than about 3.9, chosen from the group consisting of: hydrogen silsesquioxane (HSQ), benzocyclobutene (BCB), parylene, and polyimide.

6. The method according to claim 5, wherein the low k dielectric material is HSQ and each of the degassing heat treatments is performed at a temperature less than about 400° C. for not longer than about 60 seconds.

7. The method according to claim 5, wherein the low k dielectric material is BCB and each of the degassing heat treatments is performed at a temperature less than about 350° C. for not longer than about 60 seconds.

8. The method of according to claim 5, wherein the first via is a borderless via.

9. The method according to claim 4, wherein each of the first, second, and nth electrically conductive layers comprises a composite formed by:

depositing, for a time interval $t_1$, lower metal layer on a respective underlying dielectric layer;

depositing, for a time interval $t_2$, an intermediate metal layer on said lower metal layer; and depositing, for a time interval $t_3$, an upper, electrically conductive anti-reflection layer on said intermediate layer;

wherein $t_2$ is greater than $t_1$ and $t_3$.

10. The method according to claim 9, wherein the lower metal layer comprises titanium or tungsten, the intermediate metal layer comprises aluminum or aluminum alloy, and the upper anti-reflective layer comprises titanium-titanium nitride.

11. The method according to claim 4, wherein the third, fifth, and subsequently deposited corresponding dielectric layers formed over respective low k dielectric layers comprise silicon oxide obtained by plasma enhanced chemical vapor deposition (PECVD) of silane ($SiH_4$) in an $N_2O$ atmosphere or tetraethylorthosilicate (TEOS) in the presence of oxygen.

12. The method according to claim 4, comprising forming the first patterned metal layer by:

depositing a lower metal layer comprising titanium or tungsten on said first dielectric layer;

depositing an intermediate layer of aluminum or aluminum alloy on said lower metal layer;

depositing an upper, electrically conductive anti-reflective layer on said intermediate layer, thereby forming a composite; and pattern etching the composite to form the first patterned metal layer having gaps therein.

13. The method according to claim 4, comprising depositing at least one layer of electrically conductive barrier layer material in contact with the internal wall surface of each of the through-holes and in contact with the exposed upper portion of the just-formed metal feature prior to filling the through-hole with a plug of electrically conductive material.

14. The method according to claim 13, wherein said plug of electrically conductive material comprises tungsten (W).

* * * * *